United States Patent
Adachi

(10) Patent No.: US 6,800,943 B2
(45) Date of Patent: Oct. 5, 2004

(54) SOLID IMAGE PICKUP DEVICE

(75) Inventor: Yoshio Adachi, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/113,697

(22) Filed: Apr. 2, 2002

(65) Prior Publication Data

US 2002/0142510 A1 Oct. 3, 2002

(30) Foreign Application Priority Data

Apr. 3, 2001 (JP) ......................................... 2001-104572

(51) Int. Cl.[7] ........................ H01L 23/48; H01L 23/52; H01L 29/40

(52) U.S. Cl. ...................... 257/777; 257/778; 257/723; 257/431

(58) Field of Search ................................ 257/777, 778, 257/723, 431, 81, 686, 780

(56) References Cited

U.S. PATENT DOCUMENTS

| | | | | |
|---|---|---|---|---|
| 5,977,637 A | * | 11/1999 | Akamatsu et al. | 257/772 |
| 6,122,009 A | * | 9/2000 | Ueda | 348/335 |
| 6,172,351 B1 | * | 1/2001 | Kimura | 250/208.1 |
| 6,228,688 B1 | * | 5/2001 | Ohta et al. | 438/127 |
| 6,329,711 B1 | * | 12/2001 | Kawahara et al. | 257/698 |
| 6,420,213 B1 | * | 7/2002 | Nakajyo et al. | 438/118 |
| 6,504,244 B2 | * | 1/2003 | Ichinose et al. | 257/723 |
| 6,541,871 B2 | * | 4/2003 | Pai et al. | 257/777 |
| 2001/0020738 A1 | * | 9/2001 | Lizima et al. | 257/680 |
| 2001/0024178 A1 | * | 9/2001 | Takeuchi et al. | 345/55 |
| 2002/0029857 A1 | * | 3/2002 | Yamada | 156/556 |
| 2002/0051276 A1 | * | 5/2002 | Ogawa et al. | 359/245 |
| 2003/0025825 A1 | * | 2/2003 | Nakajoh | 348/374 |

FOREIGN PATENT DOCUMENTS

| | | | | |
|---|---|---|---|---|
| EP | 0828298 A2 | * | 6/1997 | ....... H01L/31/0203 |
| JP | 04334796 | * | 7/1994 | ......... H01L/25/065 |
| JP | 08288455 | * | 4/1995 | ........... H01L/21/60 |
| JP | 10214934 A | * | 1/1997 | ........... H01L/23/50 |
| JP | 9-252024 | | 9/1997 | |
| JP | 11214431 A | * | 1/1998 | ........... H01L/21/60 |
| JP | 10-84509 | | 3/1998 | |
| JP | 2000164628 | * | 11/1998 | ........... H01L/21/60 |
| JP | 2000183283 | * | 12/1998 | ........... H01L/25/10 |
| JP | 2000307053 | * | 4/1999 | ........... H01L/25/04 |
| JP | 200121067 A | * | 1/2000 | ........... H01L/21/60 |
| JP | 2001196526 | * | 1/2000 | ........... H01L/21/60 |
| KR | 2001028845 | * | 9/1999 | ........... H01L/23/14 |

* cited by examiner

Primary Examiner—Mary Wilczewski
Assistant Examiner—Monica Lewis
(74) Attorney, Agent, or Firm—Greenblum & Bernstein, P.L.C.

(57) ABSTRACT

There is provided an extremely miniaturized solid image pickup apparatus having a bare-chip-on-bare-chip structure in which a bare chip of a solid image pickup device is directly mounted on an LSI bare chip including a driving circuit, and the bare chips are electrically connected to each other without via a printed wiring board. An active surface of the LSI bare chip is protected by providing a resin layer for absorbing a stress on the active layer of the LSI bare chip existing at a lower side.

2 Claims, 10 Drawing Sheets

SOLID IMAGE PICKUP DEVICE

BACKGROUND OF THE INVENTION

1. Field of the Invention

The present invention relates to a solid image pickup apparatus and production method thereof.

2. Description of the Related Art

Conventionally, as illustrated in FIG. 10, package 2100 of solid image pickup device and package 2200 of driving circuit (including a signal transfer circuit) for the solid image pickup device are electrically connected via printed wiring board 2000.

In a conventional packaging method it is difficult to further reduce the packaging size. Moreover, since a wiring board is needed, it is also difficult to reduce the cost required for the packaging.

SUMMARY OF THE INVENTION

It is an object of the present invention to reduce the packaging size of a solid image pickup device to an ultimate size, and to greatly reduce the packaging cost.

In the present invention, a bare chip of a solid image pickup device is mounted on a bare chip of a driving circuit, and the bare chips are electrically connected without via a board structure such as a printed wiring board.

Since the bare chips are stacked, a substantial packaging size (occupation area) of the solid image pickup device is determined by a size of a bare chip at a lower side (support side). Accordingly, it is possible to reduce the packaging size of a solid image pickup device to the ultimate size.

Further, any extra member such as a printed wiring board does not exist. Accordingly, it is possible to achieve the cost reduction in packaging of solid image pickup device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

First Embodiment

Figure 1:
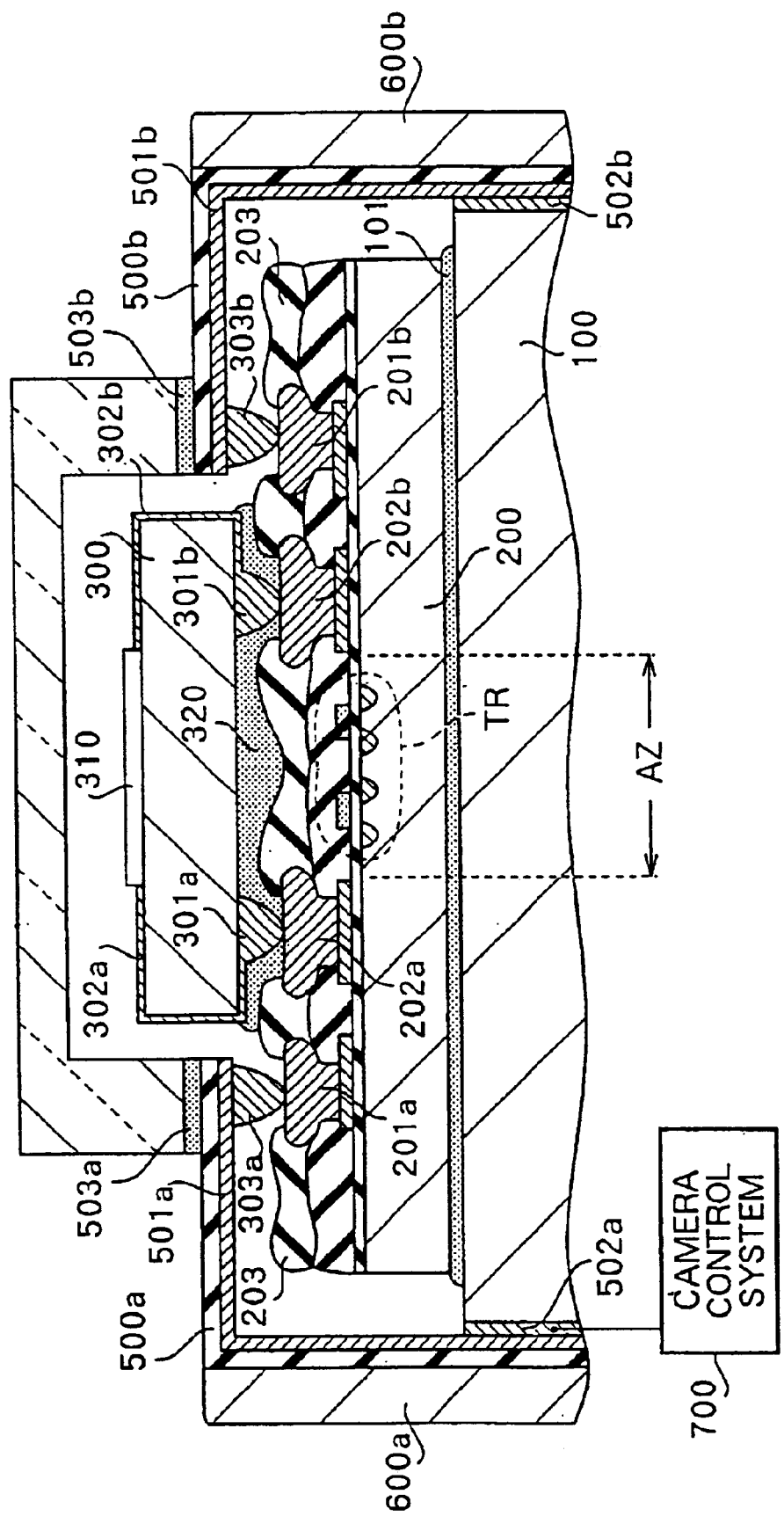
FIG. 1 is a sectional view showing a sectional structure of an example of a solid image pickup device of the present invention.

FIG. 1 is a sectional view showing an example of a solid image pickup device of the present invention.

In FIG. 1, solid image pickup device bare chip 300 with a solid image pickup device integrated thereon is mounted on LSI bare chip 200 with driving circuit, integrated thereon, (including a signal transfer circuit and other peripheral circuits) for the solid image pickup device.

Figure 2A:
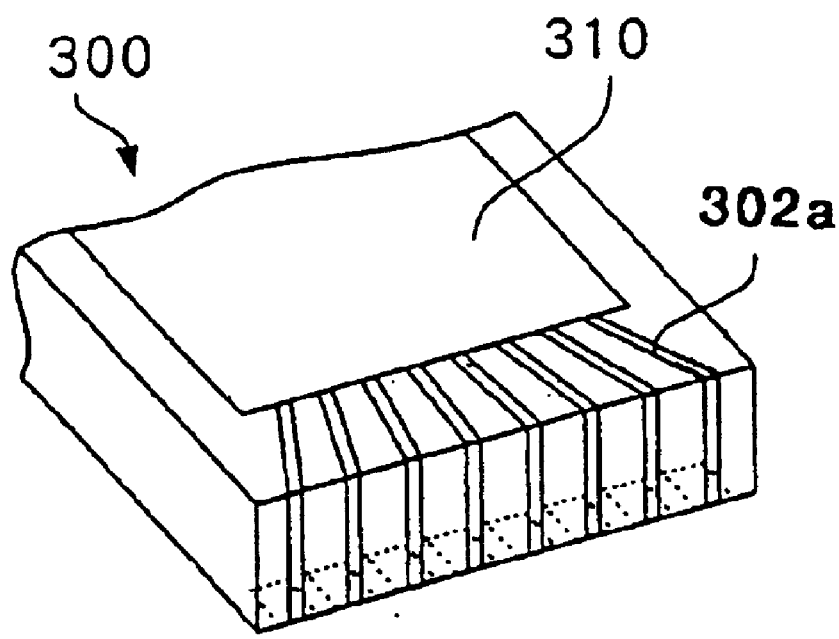
FIG. 2A is a perspective view of a primary portion of a bare chip of the solid image pickup device where bump electrodes are formed on the reverse side of the chip.
Figure 2B:
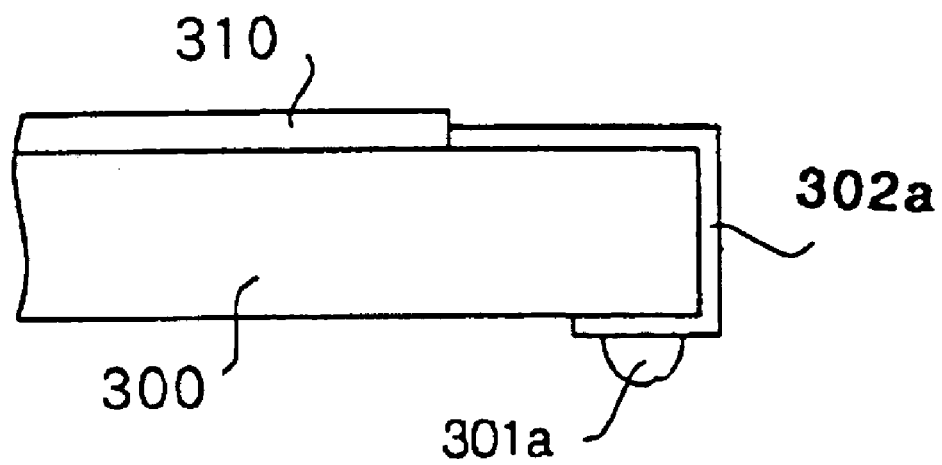
FIG. 2B is a sectional view of a primary portion of the bare chip of the solid image pickup device where bump electrodes are formed on the reverse side of the chip.

FIGS. 2A and 2B show a structure of the pickup bare chip 300 before being mounted. FIG. 2A is a perspective view of a primary portion of the pickup bare chip 300, and FIG. 2B is a sectional view of the primary portion.

In FIG. 1, the pickup bare chip 300 is bonded on LSI bare chip 200 via stress absorptive layer 320 (functioning also as an adhesive layer) made of a resin such as a polyimide resin and epoxy resin.

As shown in FIG. 1 (and FIG. 2), bump electrodes 301a and 301b are provided on the reverse side of the pickup bare chip 300.

Further, wiring layers 302a and 302b extend on parts of the bottom, and side and upper surfaces of the pickup bare chip 300.

These wiring layers 302a and 302b connect electrodes 301a and 301b to the solid image pickup device on LSI bare chip 200 respectively.

In addition, in FIGS. 1 and 2 reference numeral 310 denotes a filter member.

In FIG. 1 LSI bare chip 200 on which the driving circuit is integrated is bonded on support member (mount member) 100 with adhesive 101.

A center portion of an active surface (surface on which circuits are integrated) of LSI bare chip 200 is an active zone (in the figure, indicated by AZ) on which MOS transistor (TR) and so on are integrated.

Further, using a multilayer wiring technique (where a multilayer wiring structure is formed by providing a between-layer insulation membrane with a through hole to connect wiring of different hierarchies), electrodes 202a and 202b (first electrodes) and electrodes 201a and 201b (second electrodes) are provided on the surface of LSI bare chip 100.

In FIG. 1 reference numeral 203 denotes a final passivation membrane (final protective membrane).

Electrodes 202a and 202b (first electrodes) are respectively intended for connections to electrodes 301a and 301b on the reverse side of the pickup bare chip 300.

Electrodes 201a and 201b (second electrodes) are intended for connections to electrodes 303a and 303b formed on the reverse sides of carrier tapes (TAB tape: Tape Automated Bonding tape) 500a and 500b, respectively.

On the reverse sides of carrier tapes 500a and 500b are provided wiring layers (conductive members for external derivation) 501a and 501b electrically connected to bump electrodes 303a and 303b, respectively.

When ensuring the electric connection using bump electrodes, for example, an ultrasonic vibration of 0.03 µm is applied while applying a temperature ranging from 150° C. to 200° C. and pressure ranging from 30 g to 50 g.

Since a load caused by such applications is absorbed and buffered by stress absorptive layer 320 made of, for example, a thick film of polyimide or the like, the active surface of the LSI bare chip is protected.

Carrier tapes 500a and 500b are bent at some midpoints thereof, and the bent portions are inserted inside housings (600a and 600b), respectively.

Outer surfaces of thus inserted carrier tapes 500a and 500b are brought into intimate contact with inner walls of housings 600a and 600b, respectively.

As shown at a lower left side in FIG. 1, wiring layers (conductive members for external derivation) 501a and 501b provided on the reverse sides of carrier tapes (TAB tapes) 500a and 500b are electrically connected to, for example, camera control system 700 via conductive layers 502a and 502b provided on side surfaces of the support member (mount member), respectively.

Further, light-transparent members such as a glass are bonded on surfaces of carrier tapes 500a and 500b via adhesives 503a and 503b, respectively.

As shown in the figure, light-transparent members 500a and 500b and carrier tape housings 600a and 600b form a sealing material.

Figure 3:
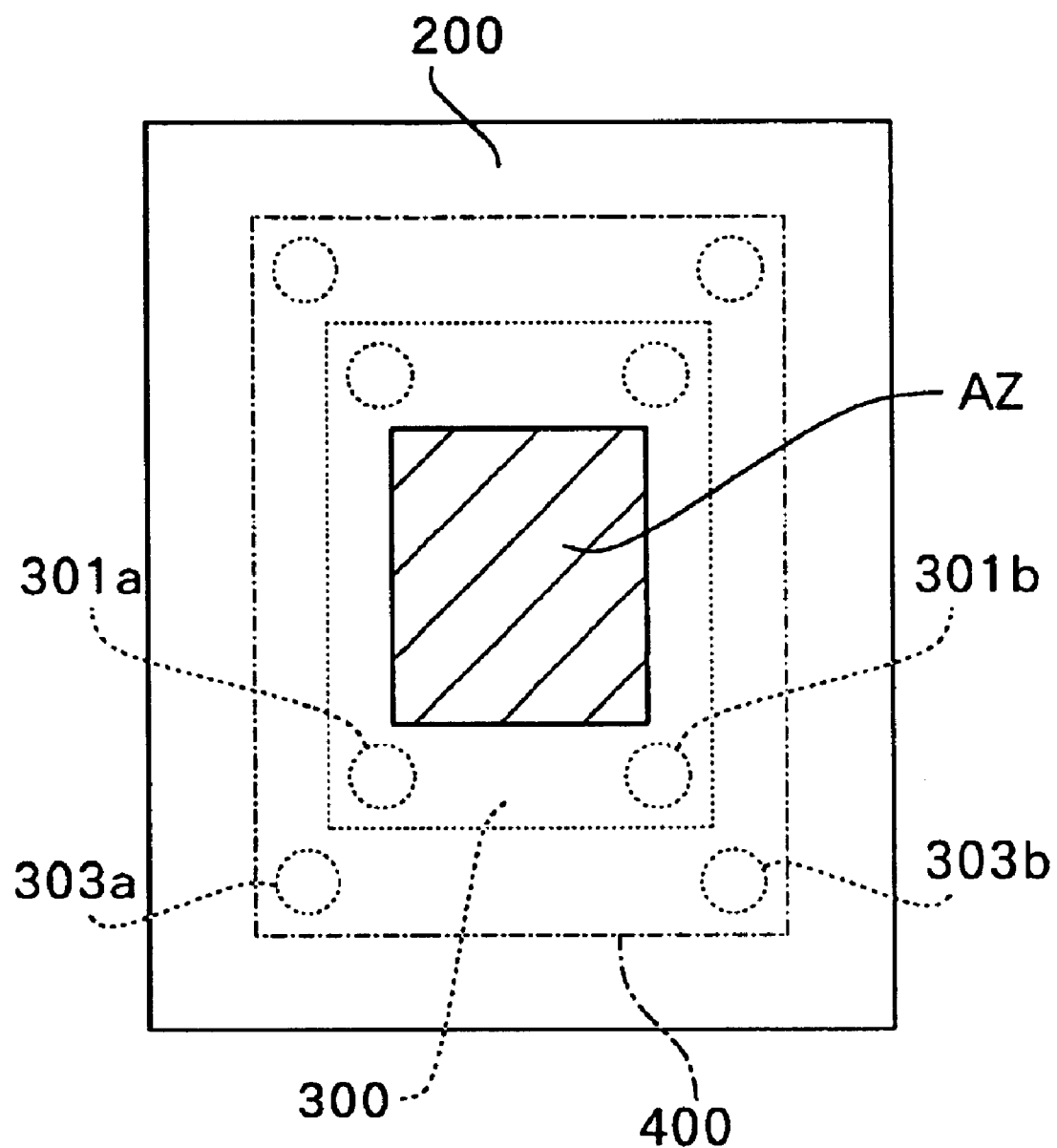
FIG. 3 is a view showing a plane position relationship between the bare chip of the solid image pickup device, LSI bare chip and a plurality of bump electrodes.

FIG. 3 shows a relationship between an arrangement (position relationship as viewed from an upper side) of stacked two bare chips and the active zone (AZ).

As shown in the figure, the bare chip (LSI bare chip) containing the driving circuit has the largest occupation area, and the center portion of the bare chip is the active zone AZ on which transistors and so on are formed.

The pickup bare chip 300 is mounted so as to cover the active zone AZ.

The bump electrodes (301a and 301b) of the pickup bare chip 300 and the bump electrodes (303a and 303b) on the reverse sides of the carrier tapes are provided, for example, to be positioned at four corners.

Since a structure is applied in which the pickup bare chip exists on the active zone of the LSI bare chip containing the driving circuit, a space under the pickup bare chip is used effectively without being wasted. Accordingly, it is possible to miniaturize a packaging structure to the ultimate size.

In addition, while in this embodiment the pickup bare chip 300 is mounted so as to completely cover the active zone (AX) of the driving circuit bare chip, the present invention is not limited to the foregoing.

In other words, by placing the pickup bare chip so that the chip has an overlap portion with part of the active zone, a space under the pickup bare chip can be used effectively without being wasted.

Figure 4:
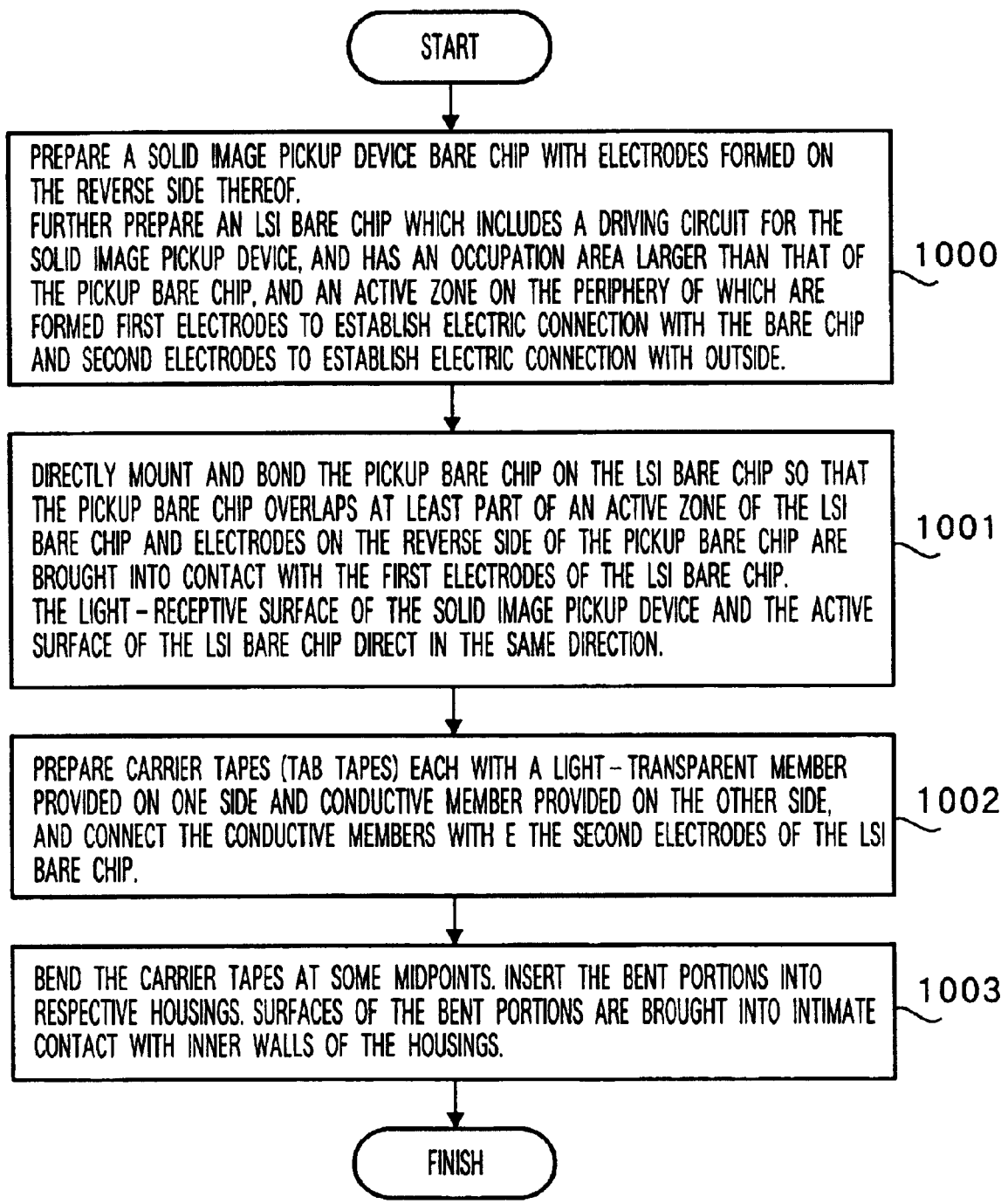
FIG. 4 is a flow diagram showing steps of forming the solid image pickup device in FIG. 1.

FIG. 4 shows basic steps of forming the packaging structure in FIG. 1.

First prepared is a solid image pickup device bare chip with electrodes formed on the reverse side thereof. Further prepared is an LSI bare chip which includes a driving circuit for the solid image pickup device, and has an occupation area larger than that of the pickup bare chip, and an active zone on the periphery of which are formed first electrodes to establish electric connection with the bare chip and second electrodes to establish electric connection with outside (step 1000).

Next the pickup bare chip is directly mounted and bonded on the LSI bare chip so that the pickup bare chip overlaps at least part of an active zone of the LSI bare chip and electrodes on the reverse side of the pickup bare chip are brought into contact with the first electrodes of the LSI bare chip.

It is preferable to provide a stress absorptive layer made of a resin or the like. The light-receptive surface of the solid image pickup device and the active surface (active zone) of the LSI bare chip direct in the same direction (upwardly) (step 1001).

Next prepared are carrier tapes (TAB tapes) each with a light-transparent member provided on one side and conductive member provided on the other side, and the conductive members are connected with the second electrodes of the LSI bare chip (step 1002).

Then, the carrier tapes (TAB tapes) are bent at some midpoints thereof, and the bent portions are inserted into respective housings. Surfaces of the bent portions are brought into intimate contact with inner walls of the housings (step 1003).

The preparation of an extremely miniaturized camera structure is thus completed.

According to this embodiment, combining a multilayer structure of bare chips using bump electrodes and TAB (Tape Automated Bonding) enables an extremely miniaturized packing structure of a solid image pickup device.

Second Embodiment

Figure 5:
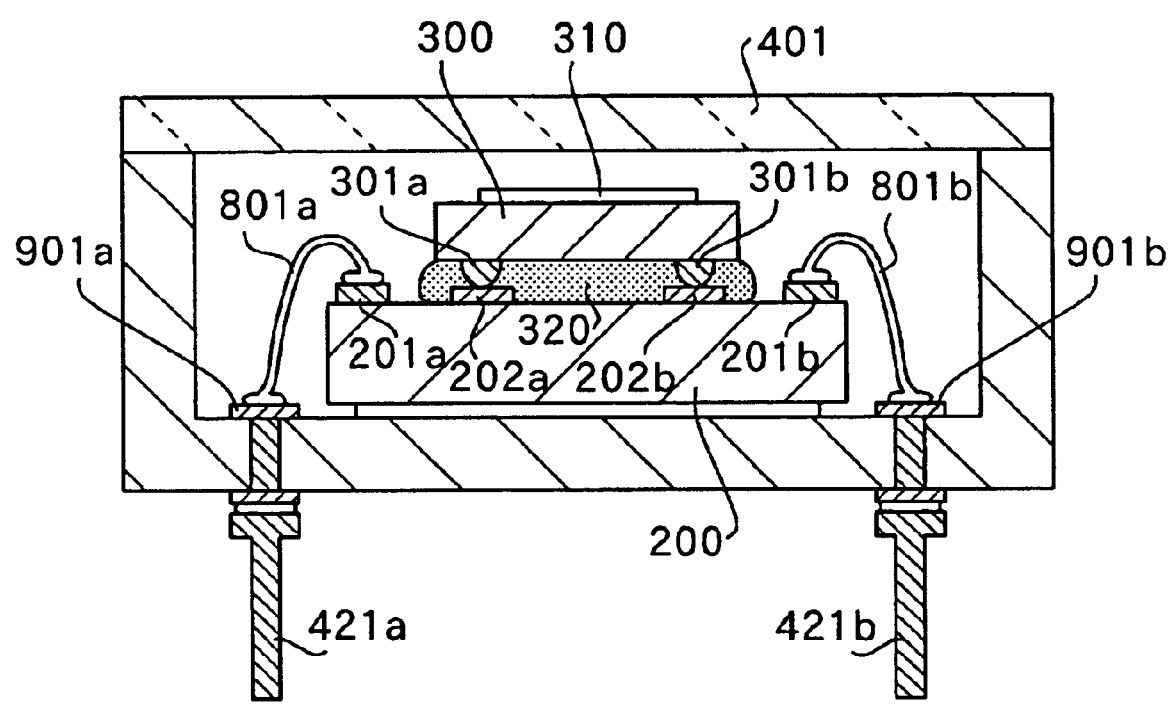
FIG. 5 is a sectional view showing another example of the solid image pickup device of the present invention.

FIG. 5 is a sectional view of another solid image pickup device of the present invention. In FIG. 5 portions common to FIG. 1 are assigned the same reference numerals as in FIG. 1.

Also in the solid image pickup device in FIG. 5, as in FIG. 1, the pickup bare chip 300 is directly mounted and bonded on LSI bare chip 200 on which the driving circuit is integrated, using a resin layer (functioning as a stress absorptive layer and adhesive layer).

The electrical conduction between the bare chips is ensured by connecting bump electrodes 301a and 301b provided on the reverse side of the pickup bare chip 300 with electrodes 202a and 202b provided on the main surface of LSI bare chip 200.

In addition, in the solid image pickup device in FIG. 5, electrodes 201a and 201b formed on the periphery of the main surface of LSI bare chip 200 are connected to external connection terminals 901a and 901b of the solid image pickup module via bonding wires 801a and 801b, respectively.

External connection terminals 901a and 902b are respectively connected to terminals 421a and 421b drawn out of the module.

On the upper surface of the solid image pickup module is provided light-transparent member 401 such as a glass. In this way, the bare chips 200 and 300 are airtight-sealed by the wall surface of the solid image pickup module and light-transparent member 401.

This embodiment provides merit enabling the utilization of the reliable wire bonding technique and existing module packaging technique.

Figure 6:
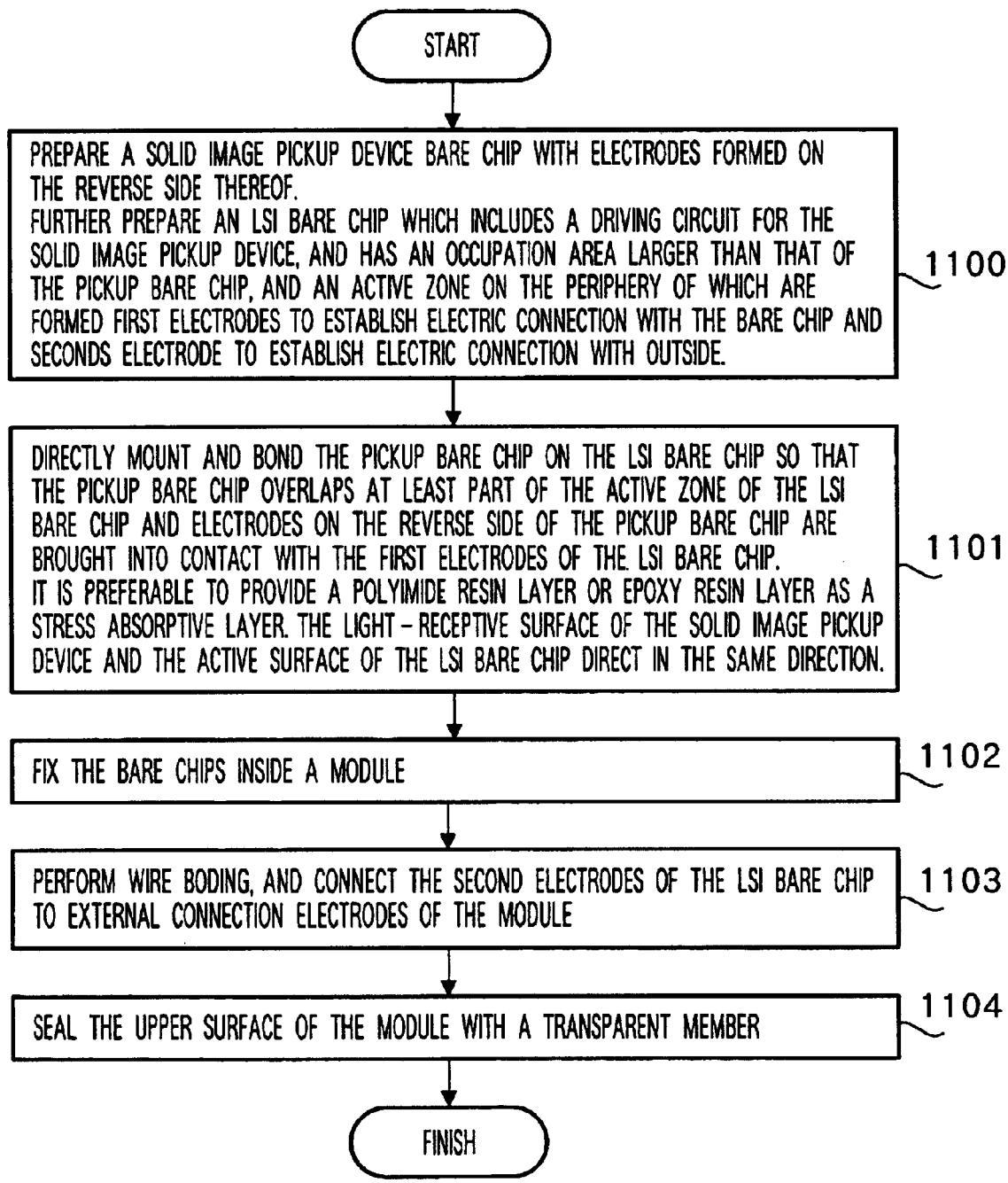
FIG. 6 is a flow diagram showing steps of forming the solid image pickup device in FIG. 5.

FIG. 6 shows processes for forming the packaging structure in FIG. 5.

First prepared is a solid image pickup device bare chip with electrodes formed on the reverse side thereof. Further prepared is an LSI bare chip which includes a driving circuit for the solid image pickup device, and has an occupation area larger than that of the pickup bare chip, and an active zone on the periphery of which are formed first electrodes to establish electric connection with the bare chip and second electrodes to establish electric connection with outside (step 1100).

Next the pickup bare chip is directly mounted and bonded on the LSI bare chip so that the pickup bare chip overlaps at least part of the active zone of the LSI bare chip and electrodes on the reverse side of the pickup bare chip are brought into contact with the first electrodes of the LSI bare chip (step 1101).

It is preferable to provide as a stress absorptive layer a polyimide resin layer or epoxy resin layer. The light-receptive surface of the solid image pickup device and the active surface of the LSI bare chip direct in the same direction.

Next the stacked bare chips are bonded on the bottom of a module (step 1102). The wire boding is then performed to connect the second electrode of the LSI bare chip to the external connection electrodes of the module (step 1103). The upper surface of the module is sealed with a transparent member (step 1104).

Third Embodiment

Figure 7:
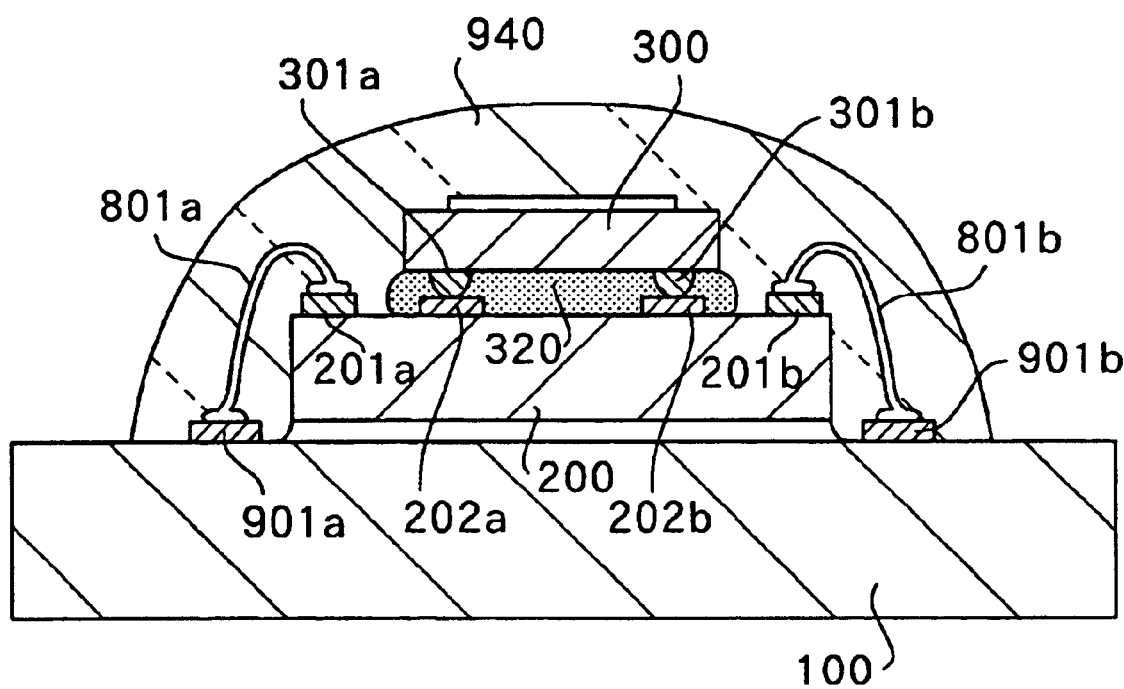
FIG. 7 is a sectional view showing another example of the solid image pickup device of the present invention.

FIG. 7 shows a packaging aspect forming a chip-size package obtained by applying a coating of transparent resin to a chip-on-chip structure with pickup bare chip 300 directly mounted on LSI bare chip 200. In FIG. 7 portions common to FIGS. 1 and 5 are assigned the same reference numerals as in FIGS. 1 and 5.

The electric connections between the two bare chips and with outside in the packaging structure in FIG. 7 are the same as in those in FIG. 5.

That is, bump electrodes are used for connection between the bare chips, and wire boding is used for connection with outside.

Between the bare chips is provided thick resin layer 320, which protects the active surface of the LSI bare chip from the heat and stress caused by the connection of bump electrodes and wire bonding.

In addition LSI bare chip 200 is bonded on mount member 100.

The packaging provided with coating 940 made of a transparent resin facilitates handling of the bare chips and improves moisture resistance or the like.

Fourth Embodiment

Figure 8A:
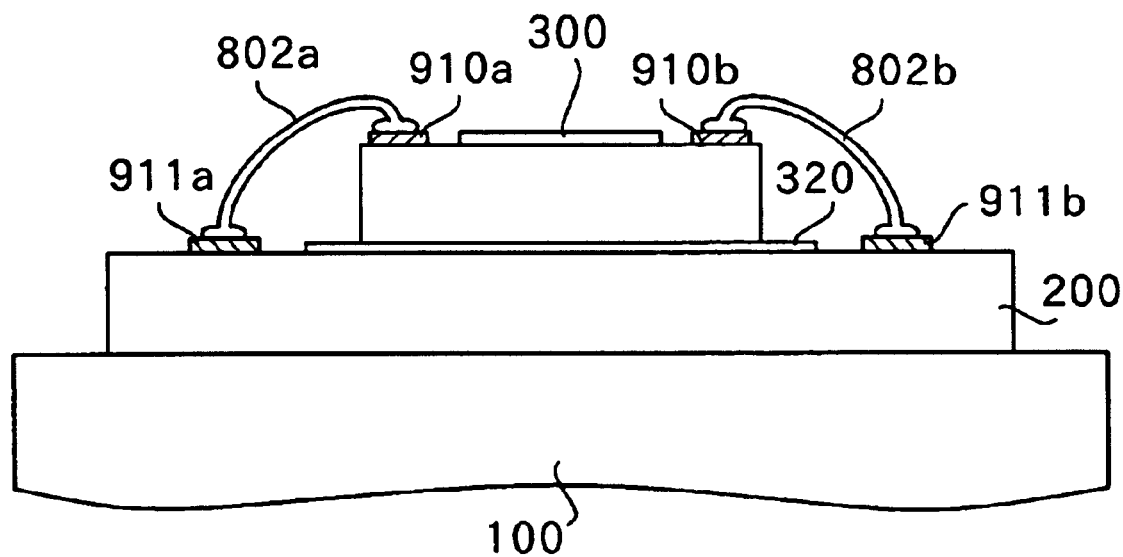
FIG. 8A is a sectional view showing an example of a packaging structure of the solid image pickup device of the present invention.

FIG. 8A shows a packaging structure in which LSI bare chip 200 is connected with the pickup bare chip 300 using bonding wires 802a and 802b.

As in the embodiments previously mentioned, resin layer 320 is provided between the bare chips.

When ensuring the electric connection using bump electrodes, for example, an ultrasonic vibration of 0.03 $\mu$m is applied while applying a temperature ranging from 150° C. to 200° C. and pressure ranging from 30 g to 50 g.

Since a load caused by such applications is absorbed and buffered by stress absorptive layer 320 made of, for example, a thick film of polyimide or the like, the active surface of the LSI bare chip is protected.

In this embodiment, since it is not necessary to provide a bump electrode on the reverse side of the pickup bare chip 300 and it is possible to use the well-tried and reliable wire bonding technique, the assembly is easy.

Figure 8B:
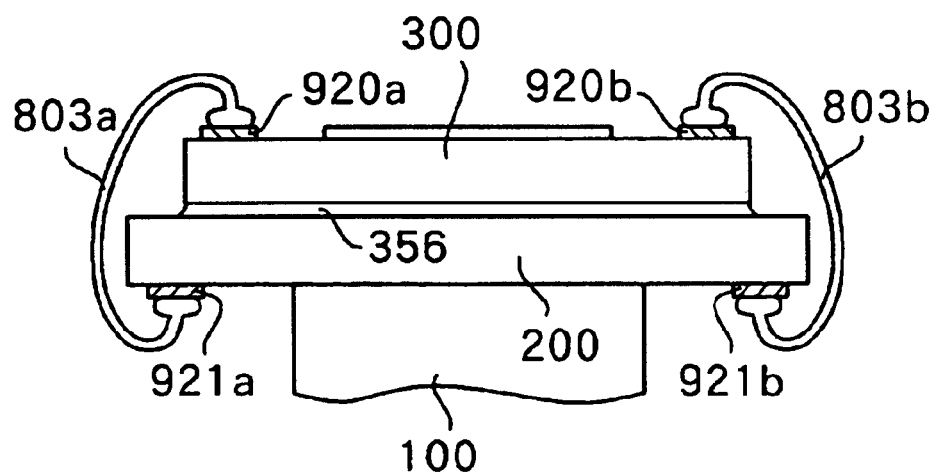
FIG. 8B is a sectional view showing another example of the packaging structure of the solid image pickup device of the present invention.

In the packaging structure in FIG. 8B, the pickup bare chip 300 is adhered on the reverse surface of LSI bare chip 200.

Electrodes (between 920a and 921a, and 920b and 921b) formed on respective main surfaces (active surfaces) of the bare chips are connected using wires 803a and 803b, respectively.

In such a structure, the light-receptive surface of the pickup bare chip and the active surface (main surface) of the LSI bare direct in opposite directions.

Since reverse surfaces of the bare chips are bonded, there is a merit that a load caused by the assembly is apt not to be imposed on the active surface of the LSI bare chip.

In addition, in order to prevent a short in the wiring, it is necessary to devise a shape and size of mount member 100 for supporting the LSI bare chip.

Figure 9:
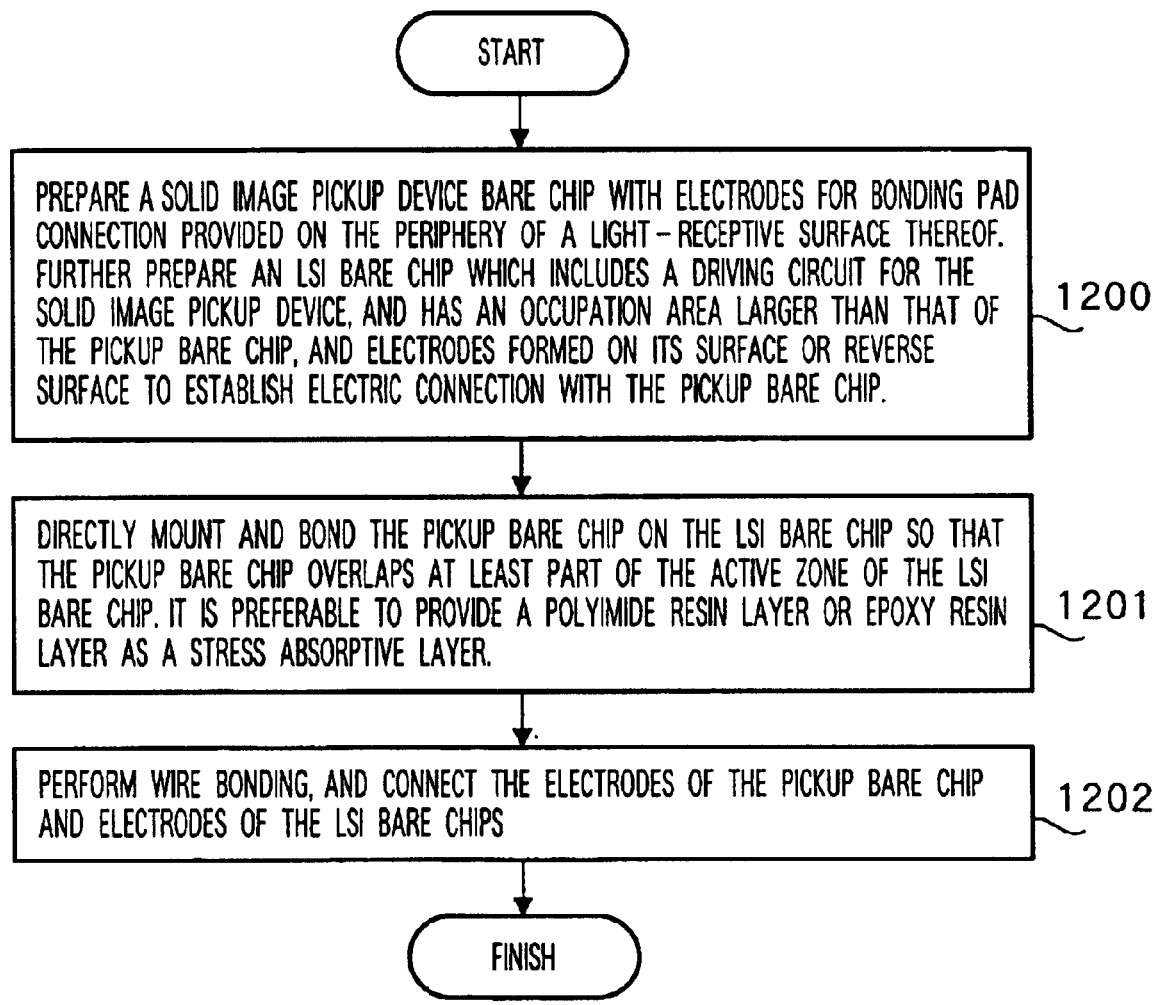
FIG. 9 is a flow diagram showing primary steps of forming solid image pickup devices shown in FIGS. 8As and 8B.
Figure 10:
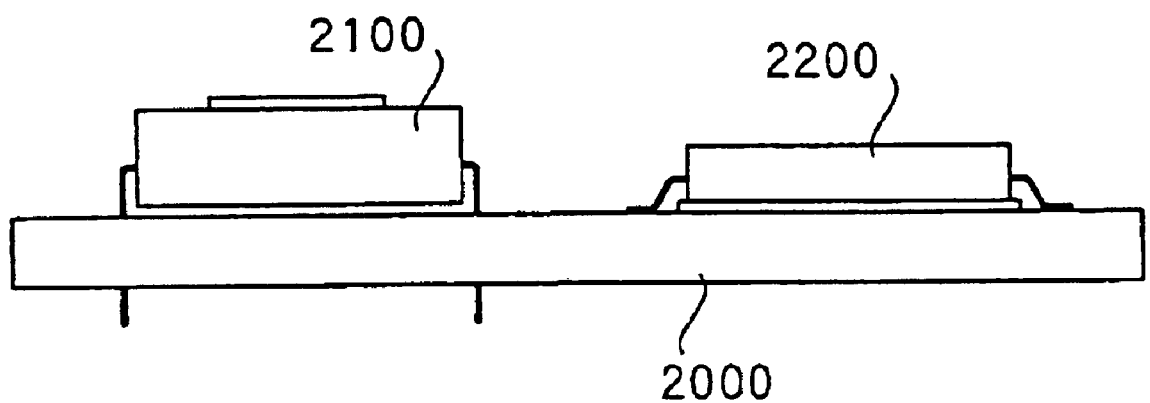
FIG. 10 is a sectional view showing a packaging structure of a conventional solid image pickup device.

FIG. 9 shows steps of forming the packaging structure shown in FIGS. 8A and 8B.

Prepared is a solid image pickup device bare chip with electrodes for bonding pad connection provided on the periphery of a light-receptive surface thereof.

Further prepared is an LSI bare chip which includes a driving circuit for the solid image pickup device, and has an occupation area larger than that of the pickup bare chip, and electrodes formed on its surface or reverse surface to establish electric connection with the pickup bare chip (step 1200).

The pickup bare chip is directly mounted and bonded on the main surface (or reverse surface) of the LSI bare chip so that the pickup bare chip overlaps at least part of the active zone of the LSI bare chip in plan view (step 1201).

It is preferable to provide a polyimide resin layer or epoxy resin layer as a stress absorptive layer when the pickup bare chip is mounted on the main surface of the LSI bare chip.

Then wire bonding is performed to connect the electrodes of the pickup bare chip and electrodes of the LSI bare chips (step 1202).

As described above, the present invention is explained using four embodiments. However, the present invention is not limited to the above embodiments.

Structures of a device such as a photoreceptor that directly receives the light and of a device such as a light-emitting device that generates the light are remarkably different from structures of devices of electronic circuits (transfer circuit and driving circuit) that handle electric signals obtained after the optoelectronic transformation. Accordingly, it is difficult to share the production processes of the both devices, and to form the devices in one-chip.

Therefore, in the present invention, respective functions of the devices are achieved in respective bare chips, and then a chip of optoprocessing system is mounted on a chip of driving circuit system, thereby forming a chip-on-chip structure.

In other words, a hierarchical structure is achieved in which an active zone of a driving system circuit is positioned under an optoprocessing zone (optoelectronic transducer zone). It is thereby possible to completely eliminate wasteful spaces.

Accordingly, the present invention is not limited to a solid image pickup device and a driving system circuit for the device, and is applicable to the use for connecting a bare chip having a light-receptive surface such as a solar cell and a bare chip with the driving system (or signal transfer system) circuit for the cell integrated thereon.

The present invention is effective in particular for use in products requiring the extreme miniaturization such as a miniaturized camera and endoscope.

As described above, the present invention adopts a bare-chip-on-bare-chip structure, where the chips directly establish electric connection without via a board such as a printed wiring board.

In this way, a substantial packaging size (occupation area) is the same as a size of a bare chip at a lower side (support side), and it is thus possible to reduce the packaging size of a solid image pickup device to the ultimate size.

Further, since any extra member such as a printed wiring board does not exist, it is possible to achieve the cost reduction in packaging of solid image pickup device.

Thus, it is possible to achieve the ultimate packaging size in miniaturization.

Moreover, it is possible to greatly reduce the packaging cost.

The present invention is not limited to the above described embodiments, and various variations and modifications may be possible without departing from the scope of the present invention.

This application is based on the Japanese Patent Application No. 2001-104572 filed on Apr. 13, 2001, entire content of which is expressly incorporated by reference herein.

What is claimed is:

1. A solid image pickup device, comprising:

an LSI bare chip, integrated with a driving circuit for a solid image pickup element and mounted on a board with an active surface of the LSI bare chip facing away from the board;

a bare chip of the solid image pickup element mounted on the LSI bare chip with a light receptive surface of said bare chip facing away from the LSI bare chip so that the light receptive surface and the active surface face a same direction, the bare chip including a reverse surface having a bump electrode, the bare chip of the solid image pickup element connecting with the LSI bare chip by bump connection and at least partially overlapping with the active surface of the LSI bare chip; and a wiring layer electrically connecting the solid image pickup element and the bump electrode, the wiring layer extending from an upper surface of the bare chip of the solid image pickup element along a side surface and to the reverse surface of the bare chip of the solid image pickup element.

2. The image pickup device according to claim 1, wherein the wiring layer extends from opposite sides of the upper surface of the bare chip of the solid image pickup element along side surfaces adjacent to the opposite sides of the upper surface.

* * * * *